United States Patent
Shim et al.

(10) Patent No.: US 9,576,987 B2
(45) Date of Patent: Feb. 21, 2017

(54) DISPLAY SUBSTRATE AND METHOD OF MANUFACTURING THE DISPLAY SUBSTRATE

(71) Applicant: SAMSUNG DISPLAY CO., LTD., Yongin, Gyeonggi-Do (KR)

(72) Inventors: Seung-Bo Shim, Asan-si (KR); Jin-Ho Ju, Seoul (KR); Jun-Gi Kim, Guri-si (KR); Yang-Ho Jung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 34 days.

(21) Appl. No.: 14/322,859

(22) Filed: Jul. 2, 2014

(65) Prior Publication Data
US 2015/0171118 A1    Jun. 18, 2015

(30) Foreign Application Priority Data

Dec. 13, 2013 (KR) .................. 10-2013-0155716

(51) Int. Cl.
*H01L 27/12* (2006.01)
*H01L 29/786* (2006.01)
(Continued)

(52) U.S. Cl.
CPC ......... *H01L 27/1248* (2013.01); *H01L 27/124* (2013.01); *H01L 27/1288* (2013.01)

(58) Field of Classification Search
CPC . H01L 27/1248; H01L 27/1288; H01L 27/124
(Continued)

(56) References Cited

U.S. PATENT DOCUMENTS 6,399,988 B1 *   6/2002   Yamazaki ........... H01L 27/1214
                                                          257/344
8,441,592 B2      5/2013   Zhou et al.
                         (Continued)

FOREIGN PATENT DOCUMENTS

JP          06-082830 A      3/1994
JP          2000-039625 A    2/2000
                         (Continued)

OTHER PUBLICATIONS

Korean Patent Abstracts, Publication No. KR 1020030061588 A, dated Jul. 22, 2003, for corresponding Korean Patent No. KR 10-0890021 B1, 1 page.

*Primary Examiner* — Long K Tran
*Assistant Examiner* — Thai T Vuong
(74) *Attorney, Agent, or Firm* — Lewis Roca Rothgerber Christie LLP (57) ABSTRACT

A display substrate includes a substrate having a first region and a second region, a conductive pattern is provided in the first region of the substrate and includes a first conductive pattern and a second conductive pattern, the first conductive pattern has a gate electrode and a source electrode, the second conductive pattern has a source electrode and a drain electrode, an insulation layer pattern is positioned on the conductive pattern and exposes an outer sidewall of the conductive pattern, an organic layer is provided in the first region and the second region of the substrate and covers the insulation layer pattern, and a pixel electrode is provided on the organic layer and is electrically connected to the drain electrode through a contact hole in the organic layer.

10 Claims, 6 Drawing Sheets

(51) Int. Cl.
*H01L 29/66* (2006.01)
*H01L 27/32* (2006.01)

(58) Field of Classification Search
USPC .............. 257/72, 59, 40, 98; 438/149, 30
See application file for complete search history.

(56) References Cited

U.S. PATENT DOCUMENTS

| | | | |
|---|---|---|---|
| 2001/0040663 A1* | 11/2001 | Jun | G02F 1/134363 349/141 |
| 2002/0013020 A1* | 1/2002 | Kim | H01L 29/456 438/149 |
| 2002/0051099 A1* | 5/2002 | Moon | G02F 1/136213 349/1 |
| 2003/0020847 A1* | 1/2003 | Kim | G02F 1/13458 349/43 |
| 2009/0209068 A1* | 8/2009 | Chang | H01L 27/1288 438/158 |
| 2010/0123845 A1* | 5/2010 | Kim | H01L 27/124 349/46 |
| 2011/0069247 A1* | 3/2011 | Zhou | G02F 1/136227 349/43 |
| 2011/0104838 A1* | 5/2011 | Ahn | G02F 1/133555 438/30 |
| 2011/0266956 A1* | 11/2011 | Park | H01L 27/1248 315/71 |
| 2011/0269254 A1* | 11/2011 | Ryu | G02F 1/133514 438/29 |

FOREIGN PATENT DOCUMENTS

| | | |
|---|---|---|
| JP | 2000-347215 A | 12/2000 |
| JP | 2004-140355 A | 5/2004 |
| JP | 2011-70194 A | 4/2011 |
| KR | 10-2003-0058214 A | 7/2003 |
| KR | 10-2005-0058594 A | 6/2005 |
| KR | 10-0890021 B1 | 3/2009 |
| KR | 10-2011-0018577 A | 2/2011 |

\* cited by examiner

DISPLAY SUBSTRATE AND METHOD OF MANUFACTURING THE DISPLAY SUBSTRATE

CROSS-REFERENCE TO RELATED APPLICATION

This application claims priority to and the benefit of Korean Patent Application No. 10-2013-0155716, filed on Dec. 13, 2013 in the Korean Intellectual Property Office (KIPO), the entire content of which is incorporated herein by reference.

BACKGROUND

1. Field

Example embodiments of the present invention relate to a display substrate and a method of manufacturing the display substrate. More particularly, example embodiments relate to a display substrate including a thin film transistor and a method of manufacturing the same.

2. Description of the Related Art

Generally, a display device may include a first display substrate, a second display substrate facing the first substrate and a liquid crystal layer interposed between the first substrate and the second substrate.

The first display substrate may include a gate line, a data line, a switching element connected to the gate line and the data line, a gate insulation layer on a gate electrode of the switching element, a passivation layer on source/drain electrodes of the switching element to partially expose the drain electrode, and a pixel electrode electrically connected to the switching element.

Light from a backlight assembly may be incident onto the back side of the first display substrate. The incident light may penetrate through the substrate, the gate insulation layer, the passivation layer, the organic layer and the pixel electrode. Accordingly, the number of the layers through which the light penetrates and the refractive index difference between the layers may deteriorate the light transmissivity of the display substrate.

SUMMARY

Example embodiments provide a display substrate capable of improving light transmissivity of the display substrate.

Example embodiments provide a method of manufacturing the display substrate.

According to example embodiments, a display substrate includes a substrate having a first region and a second region, a conductive pattern is provided in the first region of the substrate and includes a first conductive pattern and a second conductive pattern, the first conductive pattern has a gate electrode and a source electrode, the second conductive pattern has a source electrode and a drain electrode, an insulation layer pattern is positioned on the conductive pattern and exposes an outer sidewall of the conductive pattern, an organic layer is provided in the first region and the second region of the substrate and covers the insulation layer pattern, and a pixel electrode is provided on the organic layer and is electrically connected to the drain electrode through a contact hole in the organic layer.

In example embodiments, the insulation layer pattern may include silicon nitride or silicon oxide.

In example embodiments, the organic layer may make contact with the outer sidewall of the conductive pattern.

In example embodiments, the organic layer may make contact with the second region of the substrate.

In example embodiments, the substrate may have a first refractive index, the organic layer may have a second refractive index greater than the first refractive index, and the pixel electrode may have a third refractive index greater than the first refractive index.

In example embodiments, the third refractive index may be greater than the second refractive index.

In example embodiments, the display substrate may further include a gate insulation layer pattern provided on the gate electrode. The source electrode and the drain electrode may be spaced apart from each other on the gate insulation layer pattern.

In example embodiments, the organic layer may further include a color filter layer.

In example embodiments, the display substrate may further include a capping layer covering the organic layer.

In example embodiments, the organic layer may include a siloxane organic layer or an acrylic organic layer.

According to example embodiments, in a method of manufacturing a display substrate, a conductive pattern is formed on a first surface of a substrate, the conductive pattern includes a first conductive pattern and a second conductive pattern, the first conductive pattern has a gate electrode and a source electrode, the second conductive pattern has a source electrode and a drain electrode. An insulation layer is formed on the first surface of the substrate to cover the conductive pattern. A positive photoresist layer is formed on the insulation layer. The positive photoresist layer is back exposed using the conductive pattern as a mask to form the photoresist pattern on the conductive pattern. The insulation layer is etched using the photoresist pattern as an etching mask to form an insulation layer pattern on the conductive pattern. An organic layer is formed on the first surface of the substrate to cover the insulation layer pattern. A pixel electrode is formed on the organic layer which is electrically connected to the drain electrode through a contact hole of the organic layer.

In example embodiments, forming the photoresist pattern on the conductive pattern may include irradiating light onto a second surface of the substrate opposite the first surface to expose the positive photoresist layer, and developing the positive photoresist layer to form the photoresist pattern.

In example embodiments, the method may further include removing the photoresist pattern before forming the insulation layer pattern.

In example embodiments, etching the insulation layer may include partially removing the insulation layer to expose an outer sidewall of the conductive pattern.

In example embodiments, the insulation layer comprises silicon nitride or silicon oxide.

In example embodiments, the substrate may have a first refractive index, the organic layer may have a second refractive index greater than the first refractive index, and the pixel electrode may have a third refractive index greater than the first refractive index.

In example embodiments, the third refractive index may be greater than the second refractive index.

In example embodiments, the method may further include forming a gate insulation layer pattern on the gate electrode. The source electrode and the drain electrode may be spaced apart from each other on the gate insulation layer pattern.

In example embodiments, the organic layer may further include a color filter layer.

In example embodiments, the organic layer may include a siloxane organic layer or an acrylic organic layer.

According to example embodiments, light may be incident on the second region (light-transmitting region) of the substrate from a backlight assembly disposed in the rear of the display substrate. The light incident on the second surface may go through the organic layer and the pixel electrode. Only the organic layer and the pixel electrode may be formed sequentially on the light-transmitting region of the substrate, not an insulating inorganic layer having a relatively higher refractive index.

Further, the substrate may have the first refractive index, the organic layer may have the second refractive index greater than the first refractive index, and the pixel electrode may have the third refractive index greater than the first refractive index and the second refractive index.

Accordingly, the reflection due to the refractive index difference between layers of the display substrate and the number of the layers through which light penetrates may be reduced to thereby improve the transmissivity of the light incident on the substrate from the backlight assembly.

BRIEF DESCRIPTION OF THE DRAWINGS

Example embodiments will be more clearly understood from the following detailed description taken in conjunction with the accompanying drawings. FIGS. 1 to 10 represent non-limiting, example embodiments as described herein.

DETAILED DESCRIPTION

Hereinafter, example embodiments will be explained in detail with reference to the accompanying drawings.

Figure 1:
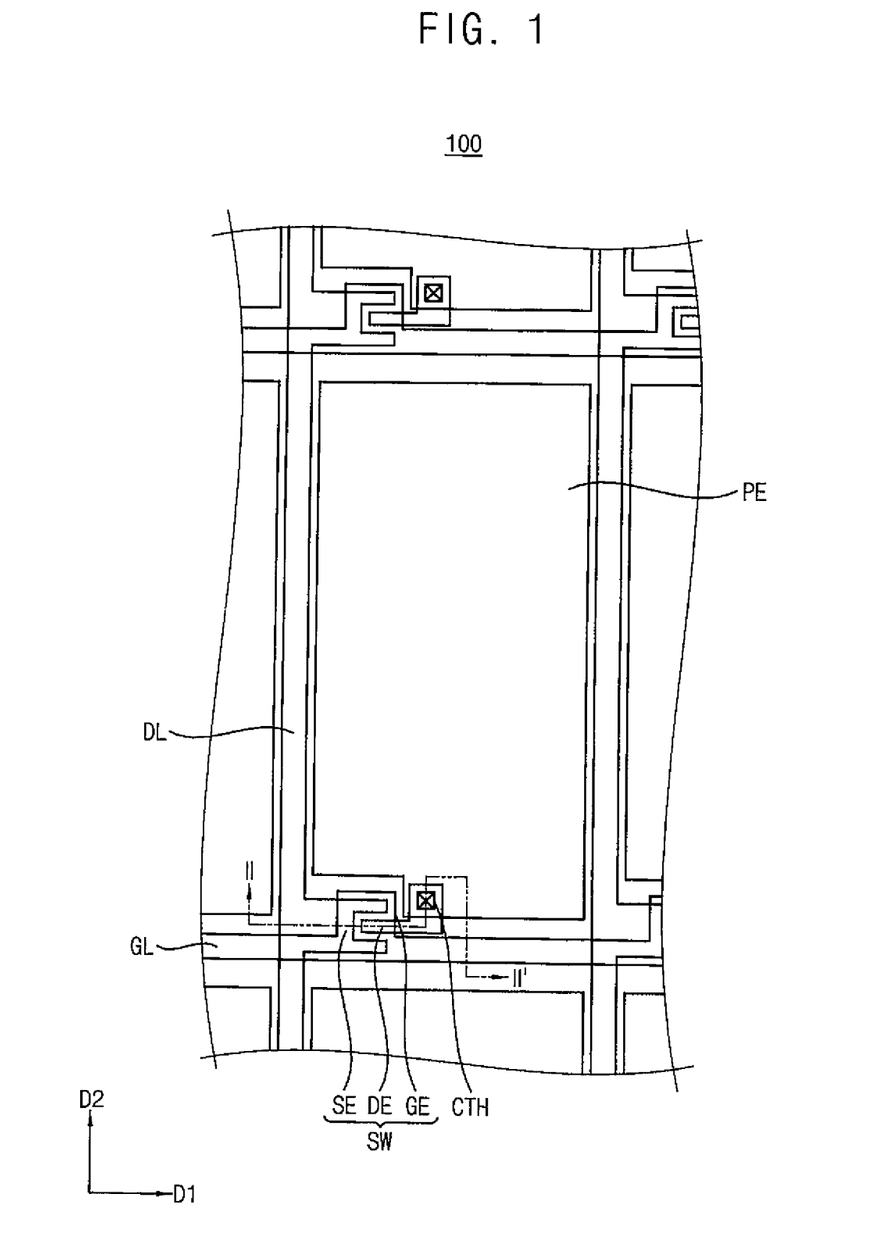
FIG. 1 is a plan view illustrating a display substrate in accordance with example embodiments.
Figure 2:
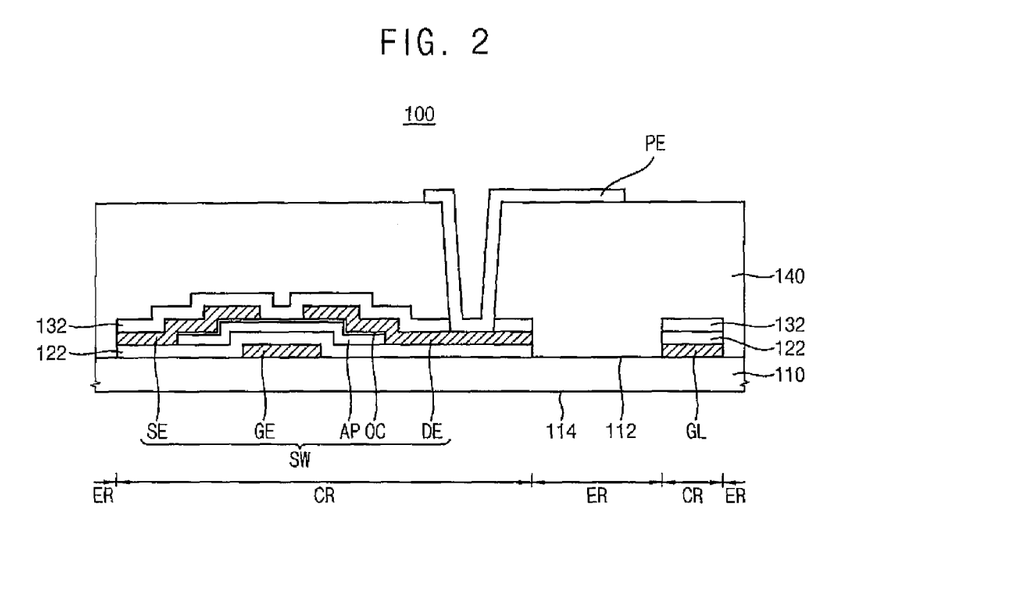
FIG. 2 is a cross-sectional view taken along the line II-II' line in FIG. 1.

FIG. 1 is a plan view illustrating a display substrate in accordance with example embodiments. FIG. 2 is a cross-sectional view taken along line II-II' of FIG. 1.

Referring to FIGS. 1 and 2, a display substrate 100 may include a substrate 110, a conductive pattern GL, GE, DL, SE, DE disposed on the substrate 110, an insulation layer pattern 122, 132 disposed on the conductive pattern, an organic layer 140 covering the insulation layer pattern 122, 132, and a pixel electrode PE disposed on the organic layer 140.

In example embodiments, the conductive pattern may include a first conductive pattern GL, GE having a gate electrode GE and a gate line GL, and a second conductive pattern DL, SE, DE having a source electrode SE and a drain electrode DE. The insulation layer pattern includes a first insulation layer pattern 122 covering the gate electrode GE and the gate line GL, and a second insulation layer pattern 132 covering the source electrode SE and the drain electrode DE.

The gate line GL may extend in a first direction (D1) on the substrate 110. The data line DL may extend in a second direction (D2) crossing the first direction (D1) on the substrate 110. For example, the first direction (D1) may be substantially perpendicular to the second direction (D2).

The gate line GL may be electrically connected to the gate electrode GE. For example, the gate electrode GE may extend from the gate line GL in the second direction (D2).

A switching device SW may include the gate electrode GE, the source electrode SE and the drain electrode DE. The source electrode SE and the drain electrode DE may be spaced apart from each other over the gate electrode GE. The switching device SW may further include an active pattern AP and an ohmic contact layer OC that are interposed between the gate electrode GE and the source/drain electrode SE, DE. The active pattern AP may include amorphous silicon. The ohmic contact layer OC may include amorphous silicon highly doped with impurities.

Alternatively, the active pattern AP may include a metal oxide semiconductor. For example, the metal oxide semiconductor may include an oxide of zinc, indium, gallium, tin, titanium, phosphor, or combination thereof. The metal oxide semiconductor may include at least one of zinc oxide (ZnO), zinc tin oxide (ZTO), zinc indium oxide (ZIO), indium oxide (InO), titanium oxide (TiO), indium gallium zinc oxide (IGZO), and indium zinc tin oxide (IZTO).

For example, the substrate 110 may include a transparent substrate. Examples of the transparent substrate may be a glass substrate, a quartz substrate, a silicon substrate, a plastic substrate, etc. The substrate 110 may have a first refractive index. The first refractive index of the substrate 110 may be within a range of about 1.40 to about 1.55. In this embodiment, the refractive index of the substrate 110 may be about 1.50.

The substrate 110 may have a first surface 112 and a second surface 114 opposite each other. The substrate 110 may include a wiring region (CR) and a light-transmitting region (ER). The wiring region (CR) may be a region in which the first conductive pattern GL, GE and the second conductive pattern DL, SE, DE are formed. The light-transmitting region (ER) may be a region which is exposed by the first and second conductive patterns when viewed in a plan view.

The first conductive pattern having the gate line GL and the gate electrode GE extending from the gate line GL may be provided in the wiring region (CR) on the first surface 112 of the substrate 110.

The first insulation layer pattern 122 may be provided on the first surface 112 of the substrate 110 to cover the gate line GL and the gate electrode GE. The gate line GL may be insulated from the data line DL by the first insulation layer pattern 122.

The first insulation layer pattern 122 may have a single-layered structure or a multi-layered structure. The first insulation layer pattern 122 may include an insulating material such as silicon nitride (SiNx), silicon oxide (SiOx), etc.

For example, the first insulation layer pattern 122 may a single-layered structure having silicon nitride. The first insulation layer pattern 122 may have a thickness of about 500 Å to about 5,000 Å. The first insulation layer pattern 122 may have a refractive index of about 1.85 to about 1.90. In this embodiment, the refractive index of the first insulation layer pattern 122 may be about 1.88.

The second conductive pattern having the source electrode SE and the drain electrode DE may be provided on the first insulation layer pattern 122. The second insulation layer pattern 132 may be provided on the first insulation layer pattern 122 to cover the second conductive pattern.

The second insulation layer pattern 132 may have a single-layered structure or a multi-layered structure. The second insulation layer pattern 132 may include an insulating material such as silicon nitride (SiNx), silicon oxide (SiOx), etc.

For example, the second insulation layer pattern 132 may include silicon nitride. The second insulation layer pattern 132 may have a thickness of about 500 Å to about 5,000 Å. The second insulation layer pattern 132 may have a refractive index of about 1.85 to about 1.90. In this embodiment, the refractive index of the second insulation layer pattern 132 may be about 1.88.

Thus, the conductive pattern, which includes the first conductive pattern having the gate electrode GE and the gate line GL and the second conductive pattern having the source electrode SE and the drain electrode DE, may be provided in the wiring region (CR) on the first surface 112 of the substrate 110.

The organic layer 140 may be provided on the first surface 112 of the substrate 110 to cover the second and first insulation layer patterns 132 and 122. The organic layer 140 may be provided in the light-transmitting region (ER) may make contact with the first surface 112 of the substrate 110.

The second insulation layer pattern 132 may expose outer sidewalls of the source/drain electrode SE, DE and the data line DL of the conductive pattern. The first insulation layer pattern 122 may expose outer sidewalls of the gate electrode GE and the gate line GL. Accordingly, an outer sidewall of the conductive pattern may make contact with the organic layer 140.

For example, the organic layer 140 may be formed using a siloxane organic layer or an acrylic organic layer. The organic layer 140 may have a second refractive index greater than the first refractive index of the substrate 110. The second refractive index of the organic layer 140 may be within a range of about 1.55 to about 1.85. In this embodiment, the refractive index of the organic layer 140 may be about 1.40.

The pixel electrode PE may be provided on the organic layer 140. The pixel electrode PE may be electrically connected to the drain electrode DE through a contact hole CTH. The pixel electrode PE may include at least one of indium zinc oxide and indium tin oxide.

The pixel electrode PE may have a third refractive index greater than the first refractive index of the substrate 110. The third refractive index of the pixel electrode PE may be within a range of about 1.85 to about 1.95. In this embodiment, the refractive index of the pixel electrode PE may about 1.95. The third refractive index of the pixel electrode PE may be greater than the second refractive index of the organic layer 140.

Hereinafter, a method of manufacturing the display substrate in FIGS. 1 and 2 will be explained in detail.

FIGS. 3 to 7 are cross-sectional views illustrating a method of manufacturing a display substrate in accordance with example embodiments.

Figure 3:
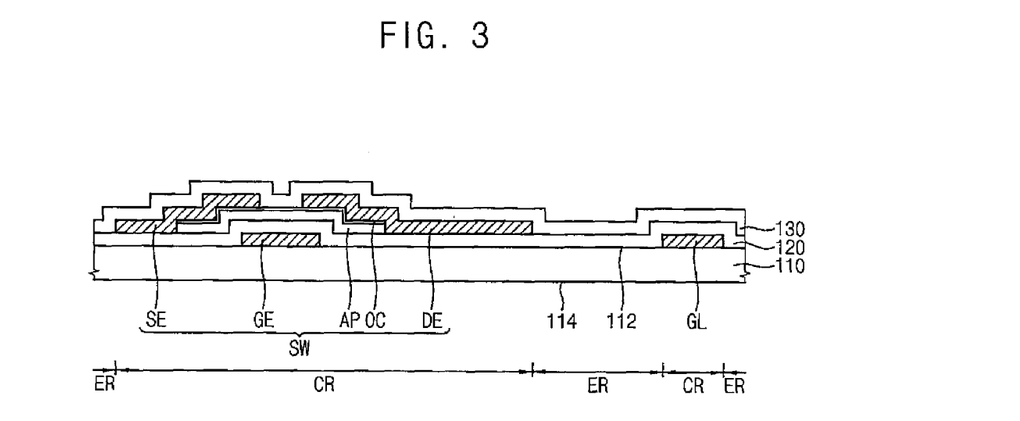
FIGS. 3 through 7 are cross-sectional views illustrating a method of manufacturing a display substrate in accordance with example embodiments.

Referring to FIG. 3, a conductive pattern including a first conductive pattern GL, GE (see FIG. 2) having a gate electrode GE and a second conductive pattern DL, SE, DE (see FIG. 2) having a source electrode SE and a drain electrode DE may be formed on a first surface 112 of a substrate 110.

For example, the substrate 110 may include a transparent substrate. Examples of the transparent substrate may be a glass substrate, a quartz substrate, a silicon substrate, a plastic substrate, etc. The substrate 110 may have a first refractive index. The first refractive index of the substrate 110 may be within a range of about 1.40 to about 1.55. In this embodiment, the refractive index of the substrate 110 may about 1.50.

The substrate 110 may have a first surface 112 and a second surface 114 opposite to each other. The substrate 110 may include a wiring region (CR) and a light-transmitting region (ER). The wiring region (CR) may be a region in which the first and second conductive patterns are formed. The light-transmitting region (ER) may be a region which is exposed by the first and second conductive patterns when viewed in a plan view.

In example embodiments, after a first conductive layer is formed on the first surface 112 of the substrate 110, the first conductive layer may be patterned to form the first conductive pattern having a gate line GL and the gate electrode GE extending from the gate line GL. Although it is not illustrated in the figures, the first conductive pattern may further include a common line extending parallel with the gate line GL.

The first conductive layer may include copper (Cu), silver (Ag), chromium (Cr), molybdenum (Mo), aluminum (Al), titanium (Ti), manganese (Mn) or alloy thereof. The first conductive layer may be formed by a sputtering process.

Then, a first insulation layer 120 may be formed on the first surface 112 of the substrate 110 to cover the first conductive pattern.

The first insulation layer 120 may be formed on the substrate 110 to cover the gate line GL and the gate electrode GE. The first insulation layer 120 may have a single-layered structure or a multi-layered structure. The first insulation layer 120 may include an insulating material such as silicon nitride (SiNx), silicon oxide (SiOx), etc.

For example, the first insulation layer 120 may include silicon nitride. The first insulation layer 120 may have a thickness of about 500 Å to about 5,000 Å. The first insulation layer 120 may have a refractive index of about 1.85 to about 1.90. In this embodiment, the refractive index of the first insulation layer 120 may be about 1.88.

Then, the second conductive pattern having the source electrode SE and the drain electrode DE may be formed on the first insulation layer 120.

In example embodiments, after an ohmic contact layer, a semiconductor layer and a second conductive layer are formed on the first insulation layer 120, the second conductive layer, the semiconductor layer and the ohmic contact layer may be patterned to form an active pattern AP, an ohmic contact layer OC, the source electrode SE and the drain electrode DE.

For example, the second conductive layer may include copper (Cu), silver (Ag), chromium (Cr), molybdenum (Mo), aluminum (Al), titanium (Ti), manganese (Mn) or alloy thereof. The semiconductor layer may include amorphous silicon, polysilicon or oxide semiconductor. For example, the active pattern AP may include amorphous silicon. The ohmic contact layer OC may include amorphous silicon highly doped with impurities.

Then, a second insulation layer 130 may be formed on the first insulation layer 120 to cover the second conductive pattern.

The second insulation layer 130 may have a single-layered structure or a multi-layered structure. The second insulation layer 130 may include an insulating material such as silicon nitride (SiNx), silicon oxide (SiOx), etc.

For example, the second insulation layer 130 may include silicon nitride. The second insulation layer 130 may have a thickness of about 500 Å to about 5,000 Å. The second insulation layer 130 may have a refractive index of about 1.85 to about 1.90. In this embodiment, the refractive index of the second insulation layer 130 may be about 1.88.

Thus, the conductive pattern, which includes the first conductive pattern having the gate electrode GE and the gate line GL and the second conductive pattern having the source electrode SE and the drain electrode DE, may be formed in the wiring region (CR) on the first surface 112 of the substrate 110.

The first insulation layer 120 may serve as a gate insulation layer for covering the gate electrode GE and the gate line DL, and the second insulation layer 130 may serve as a passivation layer for covering the source electrode SE and the drain electrode DE.

Figure 4:
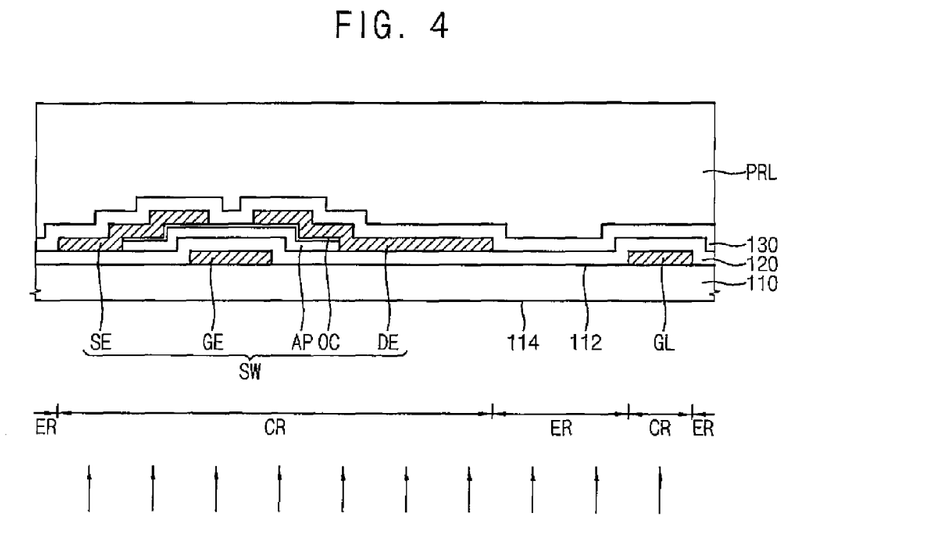
Figure 5:
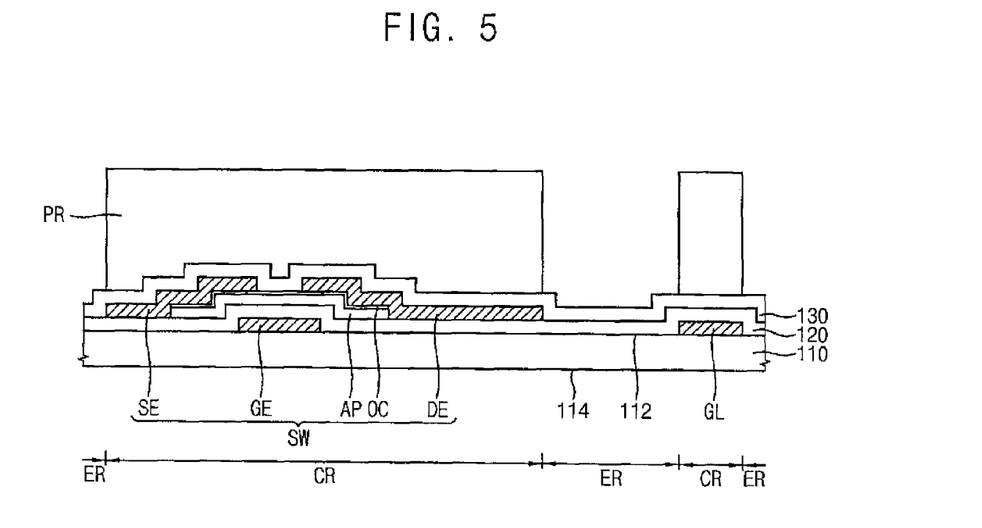

Referring to FIGS. 4 and 5, after a positive photoresist layer (PRL) is formed on the second insulation layer 130, the positive photoresist layer (PRL) may be exposed using back exposure through the substrate 110 to form a photoresist pattern PR on the conductive pattern.

As illustrated in FIG. 4, after the positive photoresist layer (PRL) is formed on the first surface 112 of the substrate 110 to cover the second insulation layer 130, the positive photoresist layer PRL may be exposed by irradiating light onto the second surface 114 of the substrate 110 opposite to the first surface 112.

A portion of the positive photoresist layer PRL exposed by the conductive pattern, that is, formed in the light-transmitting region (ER) on the first surface 112 of the substrate 110, may receive the light through the substrate 110, while another portion of the positive photoresist layer PRL covered by the conductive pattern may not receive the light through the substrate 110.

Then, as illustrated in FIG. 5, the exposed positive photoresist layer (PRL) may be developed and removed to form the photoresist pattern (PR) on the conductive pattern.

The positive photoresist layer (PRL) may be partially removed by a developing solution. In such an embodiment, the exposed portion of the positive photoresist layer (PRL) may be removed, while the remaining portion covered by the conductive pattern may remain. Accordingly, the conductive pattern may be used as a mask to form the photoresist pattern (PR) in the wiring region (CR) of the substrate 110. The photoresist pattern (PR) may expose portions of the second and first insulation layers 130 and 120 formed in the light-transmitting region (ER) of the substrate 110.

Figure 6:
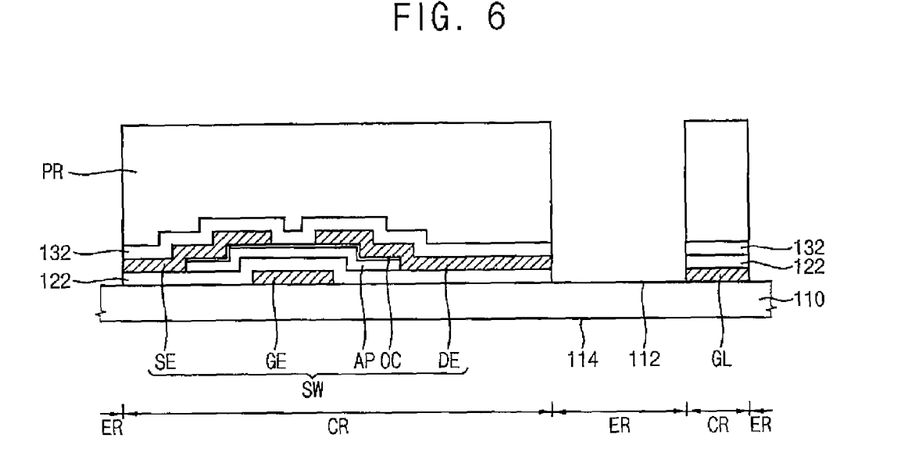

Referring to FIG. 6, the second and first insulation layers 130 and 120 may be etched using the photoresist pattern (PR) as an etching mask to form second and first insulation layer patterns 132 and 122 on the conductive pattern.

In example embodiments, the second and first insulation layers 130 and 120 may be partially removed using the photoresist pattern (PR) as an etching mask to form the second and first insulation layer patterns 132 and 122. For example, the second and first insulation layer patterns 132 and 122 may be formed by a dry etch process.

The second insulation layer pattern 132 may expose outer sidewalls of the source/drain electrode SE, DE and the data line DL of the conductive pattern. The first insulation layer pattern 122 may expose outer sidewalls of the gate electrode GE and the gate line GL.

The second insulation layer pattern 132 may cover the source electrode SE and the drain electrode DE. The first insulation layer pattern 122 may serve as a gate insulation layer pattern for covering the gate electrode GE and the gate line GL. The source electrode SE and the drain electrode DE may be spaced apart from each other on the gate insulation layer pattern.

Then, after the second and the first insulation layer patterns 132 and 122 are formed on the substrate 110, the photoresist pattern (PR) may be removed from the substrate 110.

Figure 7:
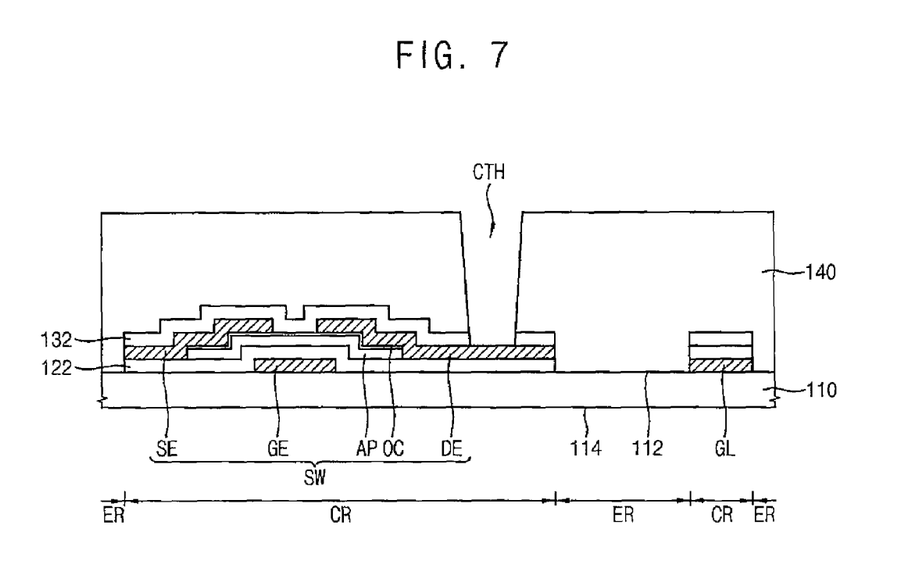

Referring to FIG. 7, an organic layer 140 may be formed on the first surface 112 of the substrate 110 to cover the second and first insulation layer patterns 132 and 122.

In example embodiments, the organic layer 140 may cover the second and first insulation layer patterns 132 and 122. An outer sidewall of the conductive pattern may make contact with the organic layer 140.

For example, the organic layer 140 may be formed using a siloxane organic layer or an acryl organic layer. The organic layer 140 may have a second refractive index greater than the first refractive index of the substrate 110. The second refractive index of the organic layer 140 may be within a range of about 1.55 to about 1.85. In this embodiment, the refractive index of the organic layer 140 may be about 1.40.

Then, the organic layer 140 and the second insulation layer pattern 132 may be partially removed to form a contact hole CTH that partially exposes the drain electrode DE.

Then, as illustrated in FIG. 2, after a transparent conductive layer is formed on the organic layer 140, the transparent conductive layer may be patterned to form a pixel electrode PE. The pixel electrode PE may be electrically connected to the drain electrode DE through the contact hole CTE. The pixel electrode PE may include at least one of indium zinc oxide and indium tin oxide.

The pixel electrode PE may have a third refractive index greater than the first refractive index of the substrate 110. The third refractive index of the pixel electrode PE may be within a range of about 1.85 to about 1.95. In this embodiment, the refractive index of the pixel electrode PE may be about 1.95. The third refractive index of the pixel electrode PE may be greater than the second refractive index of the organic layer 140.

As mentioned above, light may be incident on the light-transmitting region (ER) of the substrate 110 from a backlight assembly disposed in the rear of the display substrate 100. The light incident on the second surface 114 may go through the organic layer 140 and the pixel electrode PE. Only the organic layer 140 and the pixel electrode PE may be formed sequentially on the light-transmitting region (ER) of the substrate 110, not an insulating inorganic layer having a relatively higher refractive index.

Further, the substrate 110 may have the first refractive index, the organic layer 140 may have the second refractive index greater than the first refractive index, and the pixel electrode PE may have the third refractive index greater than the first refractive index and the second refractive index.

Accordingly, the reflection due to the refractive index difference between layers of the display substrate 100 and the number of the layers through which light penetrates may be reduced to thereby improve the transmissivity of the light incident on the substrate 110 from the backlight assembly.

Figure 8:
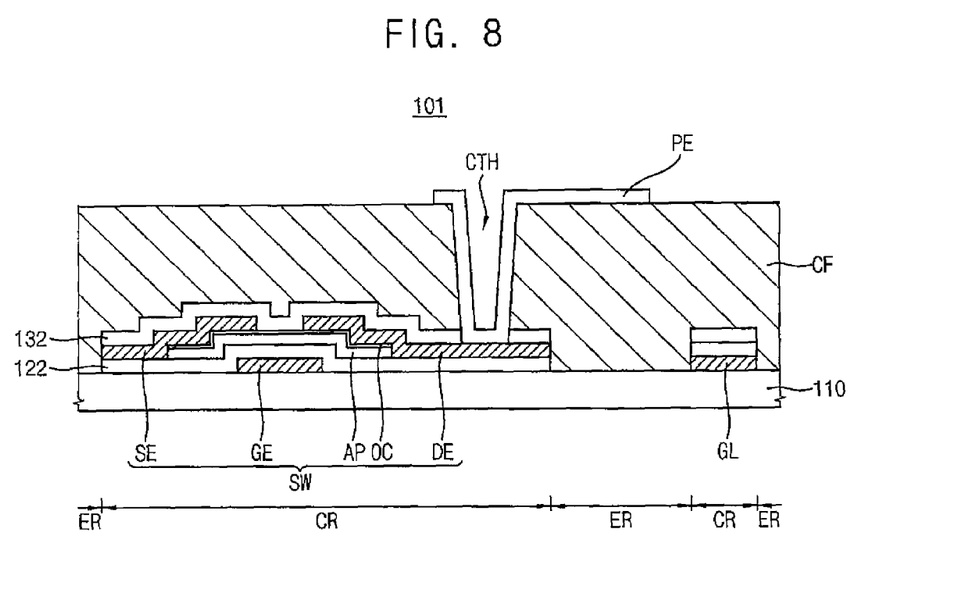
FIG. 8 is a cross-sectional view illustrating a display substrate in accordance with example embodiments.

FIG. 8 is a cross-sectional view illustrating a display substrate in accordance with example embodiments. The display substrate may be substantially the same as the display substrate in FIG. 2, except that the organic layer may further include a color filter layer. Thus, the same reference numerals will be used to refer to the same or like elements as those described with reference to FIG. 2, any further repetitive explanation concerning the above elements will be omitted.

Referring to FIG. 8, a display substrate 101 may include a substrate 110, a conductive pattern disposed on the substrate 110, an insulation layer pattern disposed on the conductive pattern, an organic layer covering the insulation layer pattern and including a color filter layer CF, and a pixel electrode PE disposed on the organic layer.

In example embodiments, the organic layer may include the color filter layer CF. The color filter layer CF may cover second and first insulation layer patterns 132 and 122 on a first surface 112 of the substrate 110.

The color filter layer CF may include a photoresist material having a blue, green or red pigment. The photoresist material having the blue pigment may have a relatively high transmissivity with respect to blue light. The photoresist material having the green pigment may have a relatively high transmissivity with respect to green light. The photoresist material having the red pigment may have a relatively high transimissivity with respect to red light.

For example, the color filter layer CF may have a second refractive index greater than a first refractive index of the substrate 110. The second refractive index of the color filter layer CF may be within a range of about 1.55 to about 1.85. In this embodiment, the refractive index of the color filter layer CF may be about 1.55.

Hereinafter, a method of manufacturing the display substrate in FIG. 8 will be explained in detail.

Figure 9:
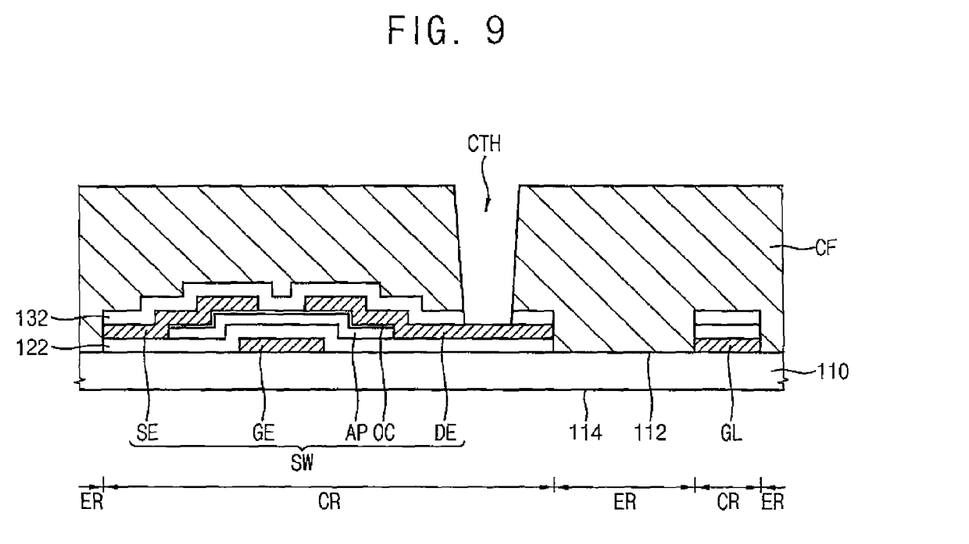
FIG. 9 is a cross-sectional view illustrating a method of manufacturing a display substrate in accordance with example embodiments.

FIG. 9 is a cross-sectional view illustrating a method of manufacturing a display substrate in accordance with example embodiments.

Referring to FIG. 9, after performing the processes described with reference to FIGS. 3 to 6, an organic layer including a color filter layer CF may be formed on a first surface 112 of a substrate 110 to cover second and first insulation layer patterns 132 and 122.

For example, a photoresist material is coated, and then, patterned to form the color filter layer CF. The photoresist material may include a blue, green or red pigment.

The color filter layer CF may have a second refractive index greater than a first refractive index of the substrate 110. The second refractive index of the color filter layer CF may be within a range of about 1.55 to about 1.85. In this embodiment, the refractive index of the color filter layer CF may be about 1.55.

Then, the color filter layer CF and the second insulation layer pattern 132 may be partially removed to form a contact hole CTH that exposes a portion of a drain electrode DE.

Then, as illustrated in FIG. 8, after a transparent conductive layer is formed on the color filter layer CF, the transparent conductive layer may be patterned to form a pixel electrode PE. The pixel electrode PE may be electrically connected to the drain electrode DE through the contact hole CTH.

The pixel electrode PE may have a third refractive index greater than the first refractive index of the substrate 110. The third refractive index of the pixel electrode PE may be within a range of about 1.85 to about 1.95. In this embodiment, the refractive index of the pixel electrode PE may be about 1.95. The third refractive index of the pixel electrode PE may be greater than the second refractive index of the color filter layer CF.

Figure 10:
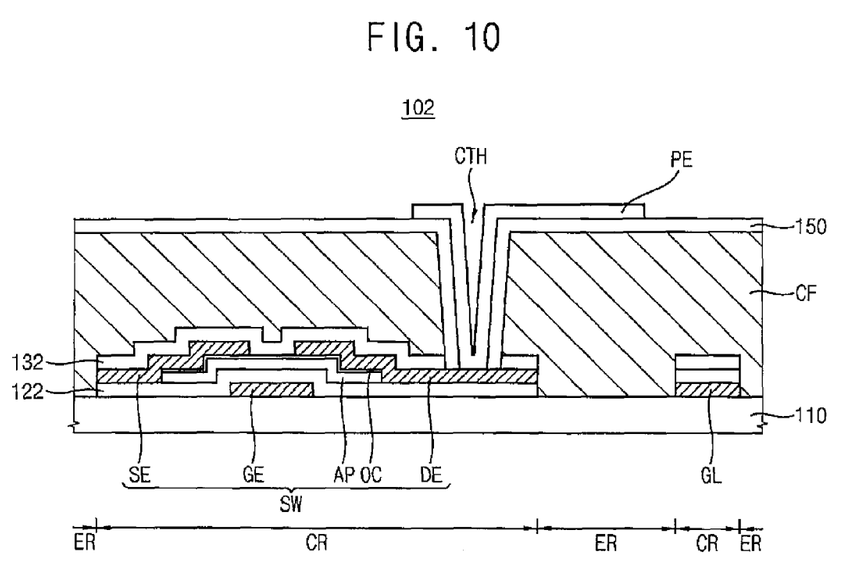
FIG. 10 is a cross-sectional view illustrating a display substrate in accordance with example embodiments.

FIG. 10 is a cross-sectional view illustrating a display substrate in accordance with example embodiments. The display substrate may be substantially the same as the display substrate in FIG. 8, except that a protection layer may be further provided on the color filter layer. Thus, the same reference numerals will be used to refer to the same or like elements as those described with reference to FIG. 8, and any further repetitive explanation concerning the above elements will be omitted.

Referring to FIG. 10, a display substrate 102 may include a substrate 110, a conductive pattern disposed on the substrate 110, an insulation layer pattern disposed on the conductive pattern, an organic layer covering the insulation layer pattern and including a color filter layer CF, a protection layer 150 covering the organic layer, and a pixel electrode PE disposed on the protection layer 150.

In example embodiments, the protection layer 150 may be provided on the organic layer. The protection layer 150 may cover an upper surface of the organic layer and sidewalls of a contact hole CTE. A drain electrode DE may be exposed through a bottom face of the contact hole CTH. The protection layer 150 may include an insulating material such as silicon nitride SiNx to serve as a capping layer.

The pixel electrode PE may be provided on the protection layer 150. The pixel electrode PE may be electrically connected to the drain electrode DE through the contact hole CTH.

Hereinafter, a method of manufacturing the display substrate in FIG. 10 will be explained in detail.

FIG. 10 is a cross-sectional view illustrating a method of manufacturing a display substrate in accordance with example embodiments.

After performing the processes described with reference to FIG. 9, the protection layer may be formed on the color filter layer CF.

For example, the protection layer 150 may be formed using an insulating material such as silicon nitride (SiNx).

Then, after the protection layer 150 is partially removed to expose a portion of the drain electrode DE, a transparent conductive layer may be formed on the protection layer 150 and then patterned to form the pixel electrode. The pixel electrode PE may be electrically connected to the drain electrode DE through the contact hole CTH.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A display substrate comprising:
    a substrate having a first region and a second region;
    a conductive pattern in the first region of the substrate and comprising a first conductive pattern and a second conductive pattern, the first conductive pattern comprising a gate electrode and a gate line, the second conductive pattern comprising a source electrode and a drain electrode;
    a gate insulation layer pattern covering the gate electrode and the gate line;
    an insulation layer pattern covering the gate electrode and the gate line and configured to expose an outer sidewall of the second conductive pattern, the gate insulating layer pattern being between the gate line and the insulation layer pattern;

an organic layer in the first region and the second region of the substrate covering the insulation layer pattern; and a pixel electrode on the organic layer and electrically connected to the drain electrode through a contact hole of the organic layer.

2. The display substrate of claim 1, wherein the insulation layer pattern comprises silicon nitride or silicon oxide.

3. The display substrate of claim 1, wherein the organic layer contacts the outer sidewall of the second conductive pattern.

4. The display substrate of claim 1, wherein the organic layer contacts the substrate at the second region thereof.

5. The display substrate of claim 1, wherein the substrate has a first refractive index, the organic layer has a second refractive index greater than the first refractive index, and the pixel electrode has a third refractive index greater than the first refractive index.

6. The display substrate of claim 5, wherein the third refractive index is greater than the second refractive index.

7. The display substrate of claim 1,
wherein the source electrode and the drain electrode are spaced apart from each other on the gate insulation layer pattern.

8. The display substrate of claim 1, wherein the organic layer comprises a color filter layer.

9. The display substrate of claim 8, further comprising a capping layer covering the organic layer.

10. The display substrate of claim 1, wherein the organic layer comprises a siloxane organic layer or an acrylic organic layer.

* * * * *